United States Patent [19]

Ushida et al.

[11] Patent Number: 5,057,788
[45] Date of Patent: Oct. 15, 1991

[54] 2-STAGE DIFFERENTIAL AMPLIFIER CONNECTED IN CASCADE

[75] Inventors: Susumu Ushida; Sadao Igarashi, both of Souma, Japan

[73] Assignee: Alps Electric Co., Ltd., Tokyo, Japan

[21] Appl. No.: 573,951

[22] Filed: Aug. 28, 1990

[30] Foreign Application Priority Data

Oct. 6, 1989 [JP] Japan ................. 1-261477

[51] Int. Cl.⁵ ............................................. H03F 3/45
[52] U.S. Cl. .................................... 330/261; 330/310
[58] Field of Search ............... 330/252, 261, 296, 310; 358/184

[56] References Cited

U.S. PATENT DOCUMENTS 4,490,685  12/1984  Sano .

FOREIGN PATENT DOCUMENTS 0095824  12/1983  European Pat. Off. ............ 330/261
0123214  7/1983   Japan .................................... 330/261

Primary Examiner—Steven Mottola
Attorney, Agent, or Firm—Guy W. Shoup; B. Noël Kivlin

[57] ABSTRACT

A two-stage differential amplifier connected in cascade according to the present invention is suitable for fabrication within an integrated circuit, in which a constant current source circuit is connected with the common emitters of the transistors in the preceding stage differential amplifier, and the emitters of the transistors in the succeeding stage differential amplifier are connected with the collectors of these transistors through impedance elements. Current consumption in the overall amplifier is reduced and heat production therein is suppressed. Furthermore, since a capacitor is connected between the collector of each of the transistors in the preceding stage differential amplifier and the base of each of the transistors in the succeeding stage differential amplifier, it is possible to match easily the input and the output impedances in the succeeding and preceding amplifier by means of this capacitor and the impedance elements described above.

1 Claim, 4 Drawing Sheets

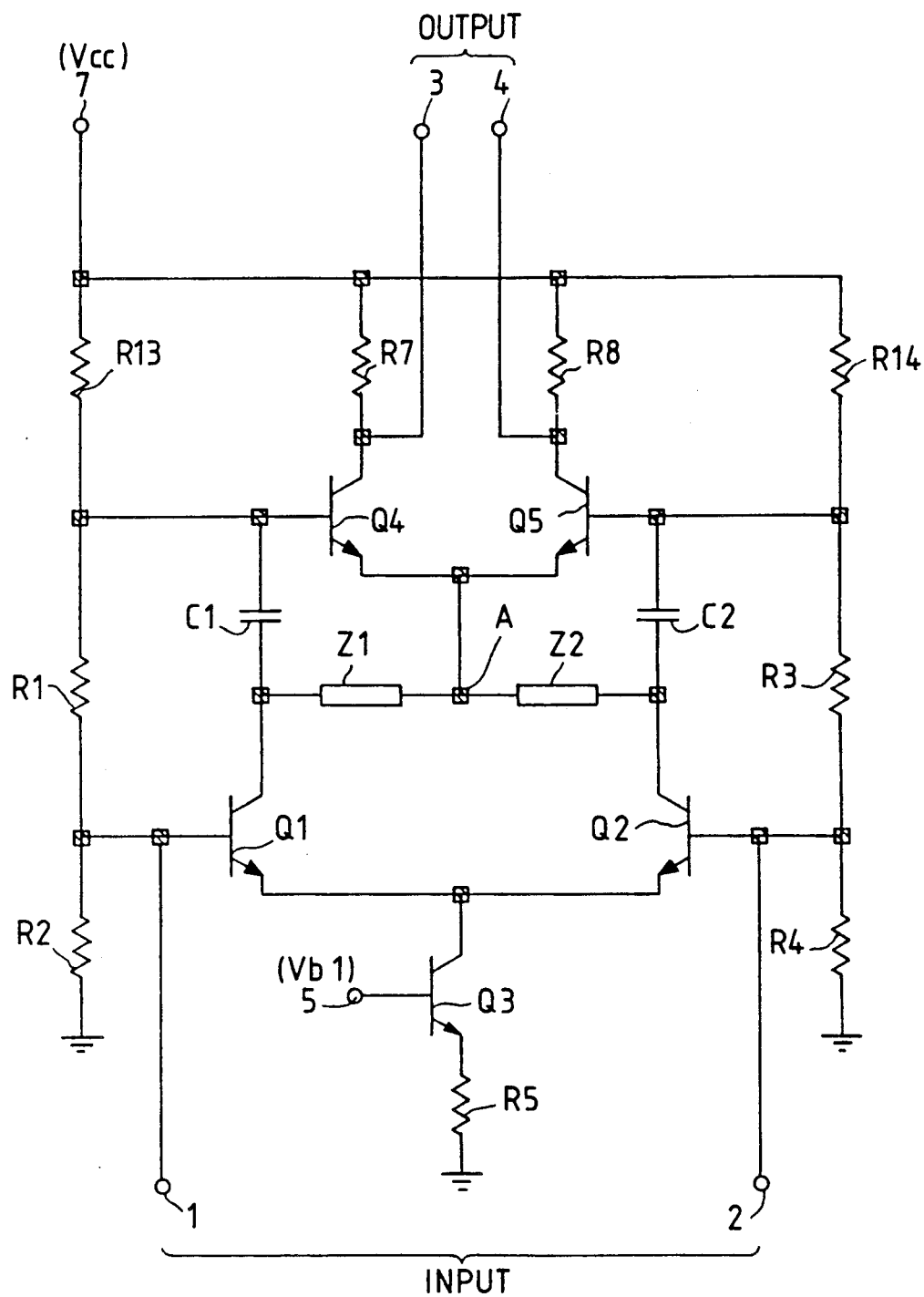

2-STAGE DIFFERENTIAL AMPLIFIER CONNECTED IN CASCADE

FIELD OF THE INVENTION

The present invention relates to a 2-stage differential amplifier connected in cascade suitable for high frequency amplification in a tuner, a modulator for TV/VTR, a CATV converter, or other apparatus.

BACKGROUND OF THE INVENTION

FIG. 3 is a circuit diagram showing the construction of a prior art differential amplifier for high frequency amplification used in a tuner for TV/VTR. In the figure, transistors Q1 and Q2 constitute a differential amplifier in the preceding stage, in which the bases of these transistors Q1 and Q2 are connected with input terminals 1 and 2, respectively. A transistor Q3 and a resistor R5 constitute a constant current source circuit which is connected between the common emitters of the transistors Q1 and Q2 and ground. Furthermore, resistors R1 and R2 are connected in series between a power supply terminal 7 and ground and a base bias voltage is supplied from the connecting point of the resistors R1 and R2 to the transistor Q1. Similarly resistors R3 and R4 are connected in series between the power supply terminal 7 and ground and a base bias voltage is supplied from the connecting point thereof to the transistor Q2. The collectors of the transistors Q1 and Q2 are connected with the power supply terminal 7 through resistors R6 and R9, respectively.

Transistors Q4 and Q5 constitute a differential amplifier in the succeeding stage. The bases of transistors Q4 and Q5 are connected with the collectors of the transistors Q1 and Q2, respectively. A transistor Q6 and a resistor R10 constitute a constant current source circuit which is connected between the common emitter of the transistors Q1 and Q2 and ground. The collectors of the transistors Q4 and Q5 are connected with the power supply terminal 7 through resistors R7 and R8, respectively.

As clearly seen from the connection relation described above, the circuit constitutes a 2-stage differential amplifier connected in cascade consisting of a preceding stage differential amplifier comprising the transistors Q1, Q2 and Q3 and the resistors R1, R2, R3, R4, R6 and R9, whose inputs are the input terminals 1 and 2, the collectors of the transistors Q1 and Q2 serving as the outputs, and a succeeding stage differential amplifier comprising the transistors Q4, Q5 and Q6 and the resistors R6, R7, R8, R9 and R10, whose inputs are the bases of the transistors Q4 and Q5, the collectors of the transistors Q4 and Q5 serving as the outputs.

The operation of the circuit described above is next explained.

At first, when the power supply Vcc is switched on, voltages are obtained at the connecting point of the resistors R1 and R2 and the connecting point of the resistors R3 and R4, respectively, dividing the power supply voltage Vcc. These voltages are applied to the base of the transistor Q1 and the base of the transistor Q2, respectively. Further the voltage Vcc is applied to the collector of the transistor Q1 through the resistor R6 and to the collector of the transistor Q2 through the resistor R9. If characteristics of the transistors Q1 and Q2 are identical and the base bias voltages applied thereto are equal to each other, the emitter currents of the transistor Q1 and Q2 are also equal to each other, the intensity of which is equal to $\frac{1}{2}$ of the collector current of the transistor Q3. Since the transistor Q3 constitutes a constant current source circuit, the collector current thereof is constant and the intensity of this current is determined unequivocally by the voltage Vb1 (arbitrary constant voltage) applied to a terminal 5 and the resistance of the resistor R5.

The voltage Vcc is applied to the bases of the transistors Q4 and Q5 through the resistors R6 and R9, respectively. If the resistances of the resistors R6 and R9 are equal to each other, the DC collector currents of the transistors Q1 and Q2 are equal to each other and therefore the voltage drops across the resistors R6 and R9 are equal to each other. Consequently, the base bias voltages of the transistors Q4 and Q5 are equal to each other and the magnitude thereof is a value obtained by subtracting the voltage drop across the resistor R6 or R9 from the voltage Vcc. Further, the voltage Vcc is applied to the collectors of the transistors Q4 and Q5 through the resistors R7 and R8. If the characteristics of the transistors Q4 and Q5 are identical, the emitter currents thereof are also equal to each other, the intensity of which is equal to $\frac{1}{2}$ of the collector current of the transistor Q6. Since the transistor Q6 constitutes a constant current source circuit the collector current thereof is constant and the intensity of this current is determined unequivocally by the voltage Vb2 (arbitrary constant voltage) applied to a terminal 6 and the resistance of the resistor R10.

In the DC operation state as described above, when a balanced high frequency signal is inputted in the terminals 1 and 2, voltages having phases opposite to each other are applied to the bases of the transistors Q1 and Q2. As a result, when the base voltage of the transistor Q1 rises and the emitter current thereof increases, the base voltage of the transistor Q2 decreases and the emitter current thereof decreases. If the base voltage of the transistor Q2 rises and the emitter current thereof increases, the base voltage of the transistor Q1 descends and the emitter current decreases. In accordance with the operations described above, since the sum of the emitter currents of the transistors Q1 and Q2 is kept constant by the action of the constant current source circuit composed of the transistor Q3, currents having a phase difference equal to 180° (opposite phase) and a same amplitude flow through the emitters of the transistors Q1 and Q2. Consequently, the collector currents of the transistors Q1 and Q2 also have phases opposite to each other and therefore an amplified balanced high frequency signal is outputted from the collectors of the transistors Q1 and Q2.

The amplified balanced high frequency signal is inputted from the collectors of the transistors Q1 and Q2 in the preceding stage differential amplifier to the bases of the transistors Q4 and Q5. In this way, voltages having phases opposite to each other are applied to the bases of the transistors Q4 and Q5. As a result, when the base voltage of the transistor Q4 rises and the emitter current thereof increases, the base voltage of the transistor Q5 descends and the emitter current decreases. Since the sum of the emitter currents of the transistors Q4 and Q5 is kept constant by the action of the constant current source circuit composed of the transistor Q6, currents having a phase differential equal to 180° (opposite phase) and a same amplitude flow through the emitters of the transistors Q4 and Q5. Consequently, the collector currents of the transistor Q4 and Q5 also have phases opposite to each other, and therefore an further amplified balanced high frequency signal is outputted from the collectors of the transistors Q4 and Q5.

The prior art circuit described above has drawbacks as described below.

1. Since a constant current source circuit is necessary for each of the stages of the differential amplifier, the circuit is complicated.

2. Since working current flows separately through the preceding stage amplifier and the succeeding stage amplifier current consumption is great and the power supply must be large. Further, associated therewith, heat production is great.

Furthermore, as a method for improving distortion characteristics of the amplifier, it is necessary to increase working current of the transistors and if such increase in the working current is realized, the problem of heat production becomes more significant. In particular, in the case of ICs or LSIs, a problem takes place that heat is apt to be accumulated because of a high density integration and it is difficult to deal with produced heat.

3. Since the total current flowing through the circuit is divided into two parts flowing through the preceding and the succeeding amplifier, unless the capacity of the power supply is considerably great, it is not possible to obtain any satisfactory working current optimizing the distortion characteristics of each of the amplifiers. Consequently the distortion characteristics are poor.

OBJECT OF THE INVENTION

The present invention has been done in view of the situation described above and the object thereof is to provide a 2-stage differential amplifier connected in cascade having a simple circuit construction, good distortion characteristics, and capable of suppressing heat production.

SUMMARY OF THE INVENTION

In order to achieve the above object, the present invention is characterized in that it comprises a first and a second transistor constituting a preceding stage differential amplifier, whose emitters are connected in common; a third and a fourth transistor constituting a succeeding stage differential amplifier, whose emitters are connected in common; a first capacitor connected between the collector of the first transistor and the base of the third transistor; a second capacitor connected between the collector of the second transistor and the base of the fourth transistor; a constant current source circuit connected between the common emitter of the first and the second transistor and the ground; and a first and a second impedance circuit connected in series between the collectors of the first and the second transistor, the common emitter of the third and the fourth transistor being connected with the connecting point of the first and the second impedance circuit.

The construction described above gives rise to a first current path consisting of the third transistor, the first transistor and the constant current source circuit, and a second current path consisting of the fourth transistor, the second transistor and the constant current source circuit. In this way, by equalizing the characteristics and the working conditions of the corresponding transistors, it is possible to equalize the intensities of the currents flowing through the current paths to each other. Therefore, the balanced high frequency signal inputted in the preceding amplifying circuit is amplified successively by the preceding and the succeeding stage amplifying circuit without destroying the balanced relation.

Furthermore, since currents having phases opposite to each other flow through the emitters of the third and the fourth transistors, AC components thereof compensate each other. As a result, the connecting point of the emitters, i.e., the connecting point of the first and the second impedance circuits, is equivalently grounded in view of the high frequency. Consequently the collectors of the first and the second transistor are grounded in view of the high frequency through the first and the second impedance circuits. In this way, an amplified balanced high frequency signal is obtained at the collectors of the first and the second transistor. and this balanced high frequency signal is supplied to the bases of the third and the fourth transistor through the first and the second capacitors. That is, the preceding and the succeeding amplifying circuit are coupled by the first and the second capacitors and the first and the second impedance circuits.

BRIEF DESCRIPTION OF THE DRAWINGS

FIG. 1 is a circuit diagram showing the construction of an embodiment of the present invention;

DETAILED DESCRIPTION

Hereinbelow, an embodiment of the present invention will be explained with reference to the drawings.

Figure 2A:
FIGS. 2A, 2N, 2C, 2D, E, 2F, 2G, and 2H are circuit diagrams showing concrete examples of the impedance circuits Z1 and Z2 in the embodiment indicated in FIG. 1.
Figure 2B:
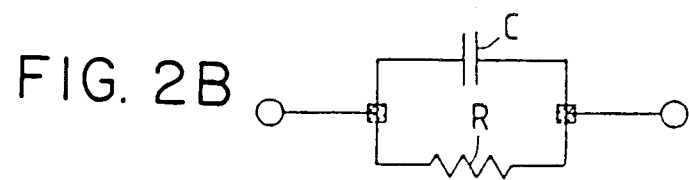
Figure 2C:
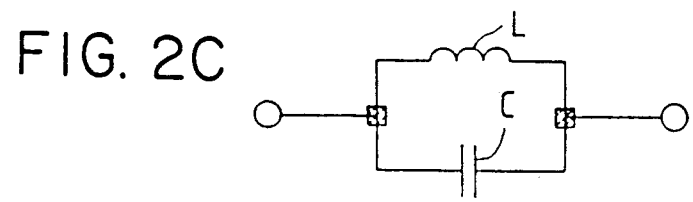
Figure 2D:
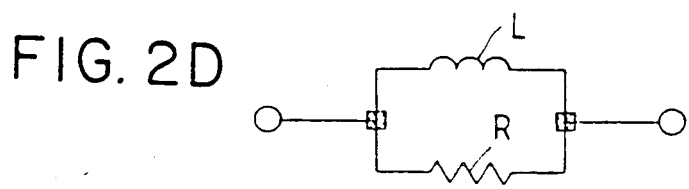
Figure 2E:
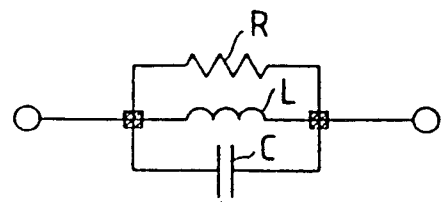
Figure 2F:
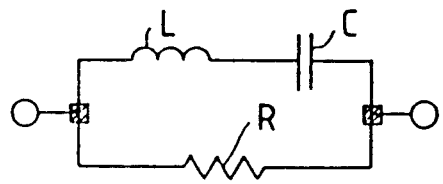
Figure 2G:
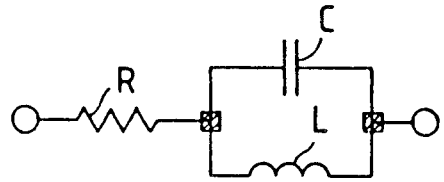
Figure 2H:
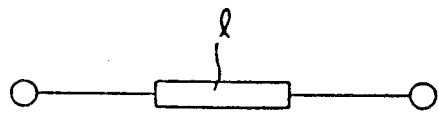
Figure 3:
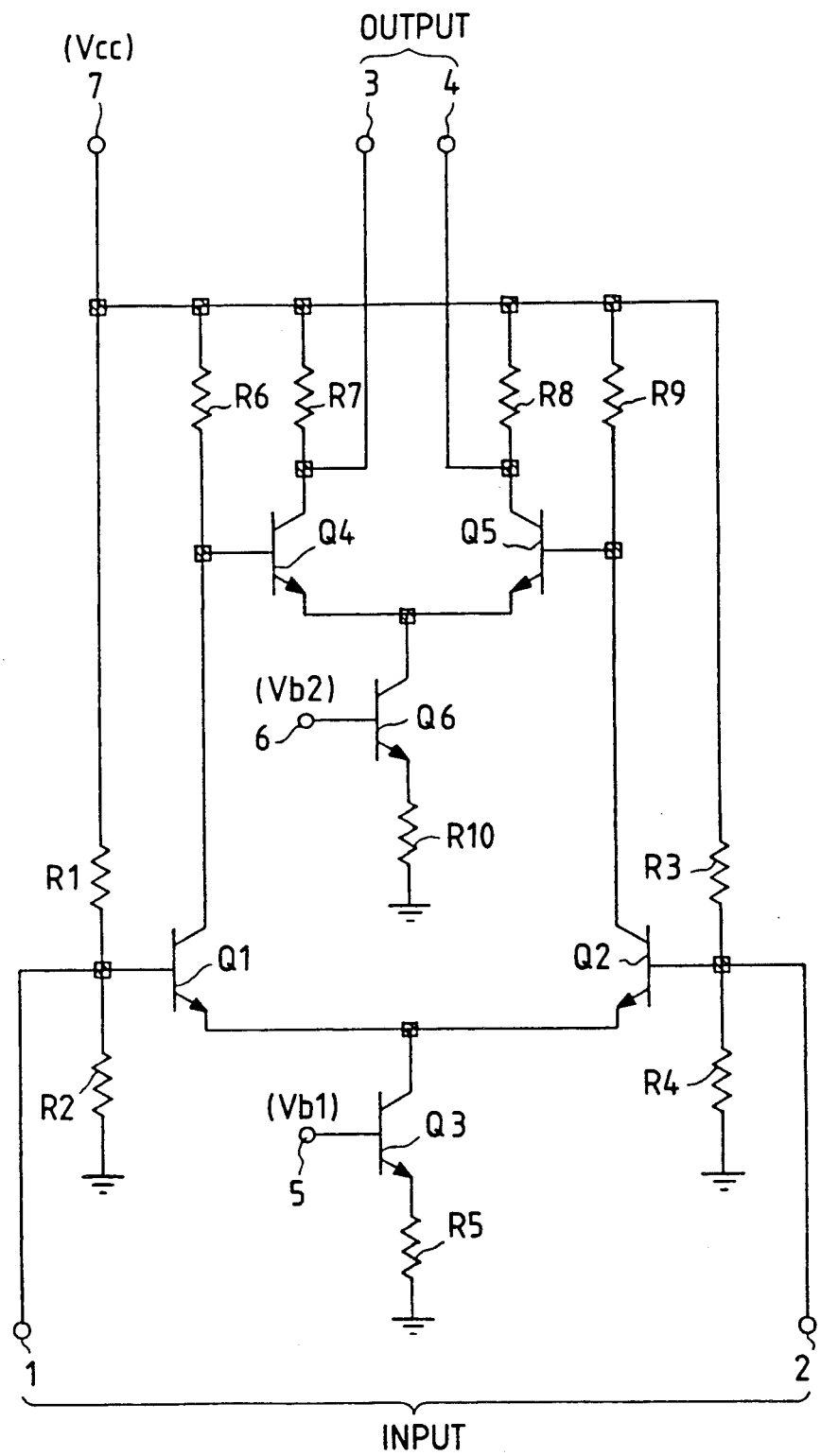
FIG. 3 is a circuit diagram showing the construction of a prior art circuit.

FIG. 1 is a circuit diagram showing the construction of the embodiment of the present invention. The parts corresponding to those indicated in FIG. 3 explained previously are denoted by the same reference numerals and explanation thereof is omitted.

This embodiment differs from the prior art circuit described previously at several points as indicated below.

A first point is that resistors R13 and R14 are inserted between the resistor R1 and the power supply terminal 7 and between the resistor R3 and the power supply terminal 7, respectively. By means thereof, the voltage Vcc is divided by the resistors R2, R1 and R13, and voltages thus obtained are applied to the bases of the transistors Q1 and Q4, acting as bias voltages. Similarly, voltages obtained by dividing the voltage Vcc by the resistors R4, R3 and R14 act as base bias voltages for the transistors Q2 and Q5.

Another point is that a coupling capacitor C1 is inserted between the collector of the transistor Q1 and the base of the transistor Q4, while a coupling capacitor C2 is inserted between the collector of the transistor Q2 and the base of the transistor Q5. Furthermore, impedance circuits Z1 and Z2 are inserted in series between the collectors of the transistors Q1 and Q2 and the connecting point of these impedance circuits Z1 and Z2 is connected with the common emitter of the transistors Q4 and Q5. The impedance circuits Z1 and Z2 are DC passing type circuits having characteristics identical to each other. Representative examples are indicated in FIGS. 2A, 2B, 2C, 2D, 2E, 2F, 2G, and 2H, in which R represents a resistor; C a capacitor; L a coil, and 1 a distributed constant line.

These are the different points between the present embodiment and the prior art circuit. It can be understood that the present embodiment is roughly composed of the preceding stage differential amplifier consisting of the transistors Q1, Q2 and Q3 and the resistors R1, R2, R3, R4, R13 and R14 (whose inputs are the input terminals 1 and 2, the outputs thereof being the collectors of the transistors Q1 and Q2), the succeeding stage differential amplifier consisting of the transistors Q4 and Q5 and the resistors R1, R2, R3, R4, R7, R8, R13 and R14 (whose inputs are the bases of the transistors Q4 and Q5, the outputs thereof being the collectors of the same transistors), and a coupling circuit consisting of the coupling capacitors C1 and C2 and the impedance circuits Z1 and Z2 inserted between the output terminals of the preceding differential amplifier and the input terminals of the succeeding differential amplifier. The overall circuit is a differential amplifier.

The operation of the embodiment using the construction described above will next be explained.

The working current of each of the transistors is first explained.

If the resistances of the resistors R1, R2 and R13 as well as the resistors R3, R4 and R14 are so determined that the base bias voltage of the transistors Q4 and Q5 and the base bias voltage of the transistors Q1 and Q5 are identical to each other, all the base currents flowing through the transistors Q1, Q2, Q4 and Q5 have a same intensity. Here there are two paths of currents to be considered, i.e. a first path of resistor R7 → transistor Q4 → impedance circuit Z1 → transistor Q1 → transistor Q3 and a second path of resistor R8 → transistor Q5 → impedance circuit Z2 → transistor Q2 → transistor Q3. If the characteristics of the transistors Q1 and Q2 as well as those of the transistors Q4 and Q5 are identical to each other, since the transistor Q3 constitutes a constant current source circuit, the intensity of the current flowing through the first path and that flowing through the second path are equal to each other, which is equal to $\frac{1}{2}$ of the collector current of the transistor Q3.

In the DC operation state described above, when the balanced high frequency signal is inputted in the terminals 1 and 2, voltages having phases opposite to each other are applied to the bases of the transistors Q1 and Q2 in the preceding stage differential amplifier. Consequently, when the base voltage of the transistor Q1 rises and the emitter current thereof increases, the base voltage of the transistor Q2 descends and the emitter current thereof decreases. When the base voltage of the transistor Q2 rises and the emitter current increases, the base voltage of the transistor Q1 descends and the emitter current decreases.

Since the sum of the emitter currents of the transistors Q1 and Q2 is kept constant due to the action of the constant current source circuit using the transistor Q3, currents having a phase difference of 180° (phases opposite to each other) and a same current amplitude flow through the emitters of the transistors Q1 and Q2. Consequently the collector currents of the transistors Q1 and Q2 have phases opposite to each other. An amplified balanced high frequency signal is taken out from the collectors of transistors Q1 and Q2.

The balanced high frequency signal amplified by the preceding stage differential amplifier is inputted in the bases of the transistors Q4 and Q5 in the succeeding stage differential amplifier through the coupling capacitors C1 and C2. As a result, since voltages having phases opposite to each other are applied to the bases of the transistors Q4 and Q5, when the base voltage of the transistor Q4 rises and the emitter current increases, the base voltage of the transistor Q5 descends and the emitter current thereof decreases. When the base voltage of the transistor Q5 rises and the emitter current thereof increases, the base voltage of the transistor Q4 descends and the emitter current decreases. Since the sum of the emitter currents of the transistors Q4 and Q5 is kept constant due to the action of the constant current source circuit using the transistor Q3, currents flowing through the transistors Q4 and Q5 have a phase difference of 180° (phases opposite to each other) and the same current amplitude. Consequently, the collector currents of the transistors Q4 and Q5 also have phases opposite to each other and a further amplified balanced high frequency signal is outputted from these collectors. Finally this balanced high frequency signal is outputted through the terminals 3 and 4.

The coupling between the preceding stage differential amplifier and the succeeding stage differential amplifier is next considered. At first, currents having a phase difference of 180° (phases opposite to each other) and the same current amplitude flow through the emitters of the transistors Q4 and Q5, as described previously. Consequently, at the point A, high frequency current components compensate each other and only a DC component flows therethrough. That is, in the coupling circuit consisting of the impedance circuits Z1 and Z2 and the coupling capacitors C1 and C2, the point A can be considered to be grounded in view of the high frequency. In this way, the collectors of the transistors Q1 and Q2 are grounded through the impedance circuits Z1 and Z2 in view of the high frequency and a high frequency output signal is obtained at the collectors of the transistors Q1 and Q2. This output signal is inputted in the bases of the transistors Q4 and Q5 in the succeeding stage differential amplifier through the coupling capacitor C1 and C2. The preceding stage differential amplifier and the succeeding stage differential amplifier are thereby coupled.

Furthermore, in the circuit described above, there are two paths, a first and a second, for working currents and the working currents in the preceding and the succeeding amplifier use each of the paths in common. Consequently, in the construction, there is disposed only one constant current source circuit for the preceding stage.

In addition, the circuit described above, under the condition that the constants for the coupling capacitor C1 and C2 and the impedance circuits Z1 and Z2 are equal to each other, it is possible to set appropriately the gain, the frequency characteristics and the distortion characteristics by choosing suitably these constants without destroying the balance characteristics of the amplifier.

As explained above, according to the present invention, the effects described below can be obtained.

1. Since one constant current source circuit is sufficient, the construction of the circuit is simplified.

2. Current consumption is reduced since working currents are used in common by the preceding and the succeeding stage differential amplifier. In addition, production is slight and for this reason it is possible to reduce operating variations with the passage of time. Therefore, it is suitable for fabricating within an integrated circuit.

3. Since the distortion characteristics are worsened with the increase in the input level, distortions in the succeeding stage amplifier are predominant with respect to those in the preceding stage amplifier. However, by using the coupling circuit between the two stages in the circuit according to the present invention, since the input level for the succeeding differential amplifier can be set at a suitable level, desired distortion characteristics can be easily obtained. Further, although distortion characteristics of an amplifier are improved, in general, when the working currents are increased, there are restrictions because of the problem of heat production due to consumed current and it is not possible to increase the current excessively. According to the present invention, since the current consumed in the circuit is used in common in the preceding stage differential amplifier and the succeeding stage differential amplifier, it is possible to increase the current flowing through each of the transistors and to obtain good distortion characteristics.

4. It is possible to match easily the preceding stage output impedance and the succeeding stage input impedance in the preceding and the succeeding stage differential amplifier and thus to widen the frequency band. Consequently, good frequency characteristics can be obtained.

What is claimed is:

1. A 2-stage differential amplifier connected in cascade comprising:
   a first and a second transistor constituting a preceding stage differential amplifier, whose emitters are connected in common;
   a third and a fourth transistor constituting a succeeding stage differential amplifier, whose emitters are connected in common;
   a first capacitor connected between the collector of said first transistor and the base of said third transistor;
   a second capacitor connected between the collector of said second transistor and the base of said fourth transistor;
   a constant current source circuit connected between the common emitters of said first and said second transistors and ground; and
   a first and a second impedance circuit connected in series between the collectors of said first and said second transistor, the common emitter of said third and said fourth transistor being connected with the connecting point of said first and said second impedance circuit.

* * * * *